US012015403B2

(12) United States Patent
Kang et al.

(10) Patent No.: US 12,015,403 B2
(45) Date of Patent: Jun. 18, 2024

(54) SEMICONDUCTOR APPARATUS PERFORMING A PLURALITY OF CLOCK SIGNALING OPERATIONS AND SEMICONDUCTOR SYSTEM INCLUDING THE SAME

(71) Applicant: SK hynix Inc., Icheon-si (KR)

(72) Inventors: Ji Hyo Kang, Icheon-si (KR); Kyung Hoon Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 10 days.

(21) Appl. No.: 18/084,240

(22) Filed: Dec. 19, 2022

(65) Prior Publication Data

US 2023/0370066 A1    Nov. 16, 2023

(30) Foreign Application Priority Data

May 16, 2022    (KR) ................. 10-2022-0059597

(51) Int. Cl.
*G06F 1/06*    (2006.01)
*G06F 1/10*    (2006.01)
*G06F 1/12*    (2006.01)
*H03K 17/687*    (2006.01)
*H03K 19/0185*    (2006.01)

(52) U.S. Cl.
CPC ....... *H03K 19/018521* (2013.01); *G06F 1/06* (2013.01); *G06F 1/10* (2013.01); *G06F 1/12* (2013.01); *H03K 17/6872* (2013.01)

(58) Field of Classification Search
None
See application file for complete search history.

(56) References Cited

U.S. PATENT DOCUMENTS

| | | | |
|---|---|---|---|
| 11,233,500 B1* | 1/2022 | Kang | ........................ G06F 1/10 |
| 11,256,285 B2* | 2/2022 | Seo | ........................ H03K 5/135 |
| 11,625,062 B2* | 4/2023 | Kang | ................ H03K 19/0963 |
| | | | 327/291 |
| 2019/0253055 A1* | 8/2019 | Jang | ........................ G06F 1/10 |

FOREIGN PATENT DOCUMENTS

| KR | 100912968 B1 | 8/2009 |
|---|---|---|
| KR | 1020110024303 A | 3/2011 |

* cited by examiner

*Primary Examiner* — Jeffrey S Zweizig
(74) *Attorney, Agent, or Firm* — WILLIAM PARK & ASSOCIATES LTD.

(57) ABSTRACT

A semiconductor apparatus includes a clock distribution network, a data output circuit, and a data input circuit. The clock distribution network receives a system clock signal and drives the system clock signal to a CMOS level and a CML level to signal in different manners. The data output circuit outputs data based on the clock signal driven to the CMOS level. The data input circuit receives data based on the clock signal driven to the CML level.

18 Claims, 6 Drawing Sheets

"clock" appears OCR'd as "dock" in many places in source.

SEMICONDUCTOR APPARATUS PERFORMING A PLURALITY OF CLOCK SIGNALING OPERATIONS AND SEMICONDUCTOR SYSTEM INCLUDING THE SAME

CROSS-REFERENCES TO RELATED APPLICATION

The present application claims priority under 35 U.S.C. § 119(a) to Korean application number 10-2022-0059597, filed on May 16, 2022, in the Korean Intellectual Property Office, which is incorporated herein by reference in its entirety as set forth in full.

BACKGROUND

1. Technical Field

Various embodiments generally relate to an integrated circuit technology, and, more particularly, to a semiconductor apparatus performing a plurality of dock signaling operations and a semiconductor system including the same.

2. Related Art

An electronic device includes a lot of electronic elements and a computer system as the electronic device includes lots of semiconductor apparatuses each configured by a semiconductor. The semiconductor apparatuses configuring the computer system may communicate with each other by transmitting and/or receiving a system clock signal and data. In synchronization with a clock signal, the semiconductor apparatus may perform a data communication. The semiconductor apparatus may drive the provided system clock signal, with which the data is to be synchronized, and provide a data input/output circuit with the driven dock signal. In synchronized with the driven dock signal, the data input/output circuit may output the data to another semiconductor apparatus. The semiconductor apparatus may include a dock distribution network to drive the system dock signal and distribute the driven dock signal to the data input/output circuit. The frequency of the system dock signal becomes higher as the operating speed of a computer system increases. In order to perform a stable signaling operation on the system clock signal having a high frequency, the semiconductor apparatus may drive the clock signal to a current mode logic (CML) level.

SUMMARY

In an embodiment, a semiconductor apparatus may include a global clock tree, a data output circuit, and a data input circuit. The global clock tree may be configured to drive a system clock signal to a complementary metal oxide semiconductor (CMOS) level to generate a first distribution clock signal and configured to drive the system clock signal to a current mode logic (CML) level to generate a second distribution clock signal. The data output circuit may be configured to output data based on the first distribution clock signal. The data input circuit configured to receive the data based on the second distribution clock signal.

In an embodiment, a semiconductor apparatus may include a global clock tree and a local clock tree. The global clock tree may be configured to drive a system dock signal to a complementary metal oxide semiconductor (CMOS) level to generate a first distribution dock signal, configured to transmit the first distribution dock signal through a first dock transmission line, configured to drive the system dock signal to a current mode logic (CML) level to generate a second distribution dock signal and configured to transmit the second distribution dock signal through a second dock transmission line. The local dock tree may be configured to receive the first distribution dock signal through the first dock transmission line, configured to generate a read dock signal based on the first distribution dock signal, configured to receive the second distribution clock signal through the second clock transmission line, and configured to generate a write clock signal based on the second distribution dock signal.

In an embodiment, a semiconductor apparatus may include a global dock tree and a local dock tree. The global clock tree may be configured to receive a system dock signal, configured to generate a first distribution dock signal during a read operation of the semiconductor apparatus and configured to generate a second distribution dock signal during a write operation of the semiconductor apparatus. The second distribution dock signal may swing within a smaller range than the first distribution dock signal. The local dock tree may be configured to generate a data output dock signal from the first distribution dock signal during the read operation and configured to generate a data input dock signal from the second distribution dock signal during the write operation.

In an embodiment, a semiconductor apparatus may include a global dock tree and a local dock tree. The global clock tree may be configured to receive a system dock signal and configured to generate one of a first distribution clock signal and a second distribution dock signal according to a type of operation that the semiconductor apparatus performs and a frequency mode. The first distribution dock signal may be driven to a complementary metal oxide semiconductor (CMOS) level and the second distribution clock signal may be driven to a current mode logic (CML) level. The local clock tree may be configured to generate, according to the type of operation and the frequency mode, a data output clock signal from one of the first distribution clock signal and the second distribution clock signal and a data input clock signal from one of the first distribution clock signal and the second distribution clock signal.

In an embodiment, a semiconductor apparatus may include a global clock tree and a local clock tree. The global clock tree may be configured to receive a system clock signal and configured to generate one of a first distribution clock signal and a second distribution clock signal according to a type of operation that the semiconductor apparatus performs, a frequency mode and a voltage mode. The first distribution clock signal may be driven to a complementary metal oxide semiconductor (CMOS) level and the second distribution clock signal may be driven to a current mode logic (CML) level. The local clock tree may be configured to generate, according to the type of operation, the frequency mode and the voltage mode, a data output dock signal from one of the first distribution dock signal and the second distribution dock signal and a data input clock signal from one of the first distribution clock signal and the second distribution dock signal.

DETAILED DESCRIPTION

Figure 1:
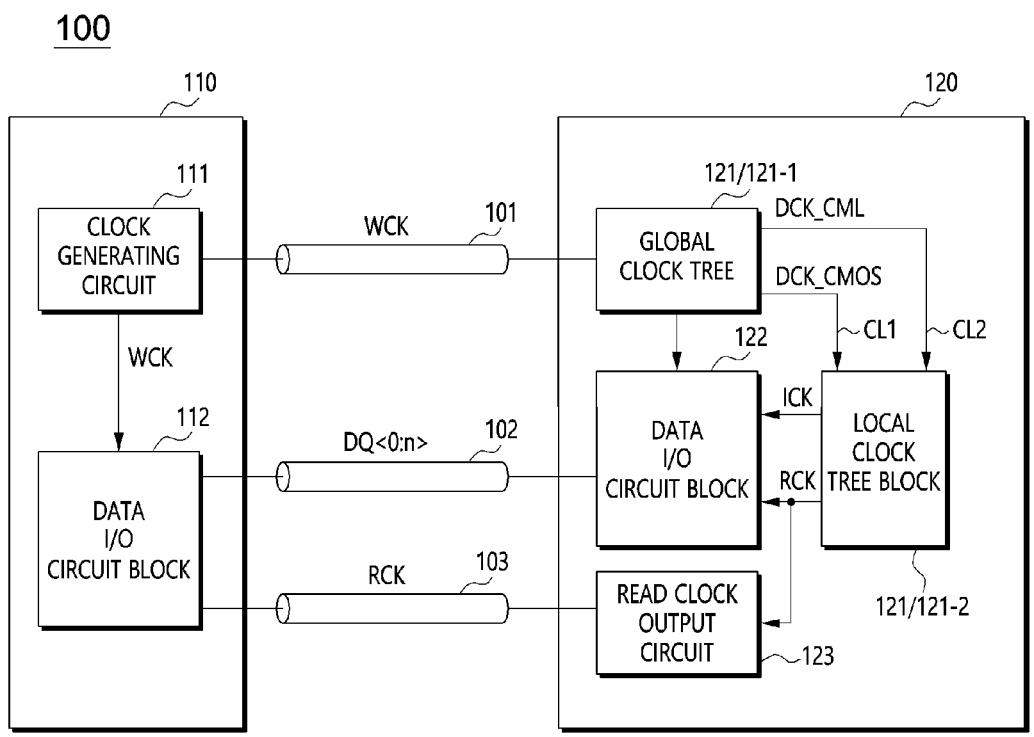
FIG. 1 is a diagram illustrating a configuration of a semiconductor system in accordance with an embodiment.

FIG. 1 is a diagram illustrating a configuration of a semiconductor system 1 in accordance with an embodiment. Referring to FIG. 1, the semiconductor system 1 may include an external apparatus 110 and a semiconductor apparatus 120. The external apparatus 110 and the semiconductor apparatus 120 may perform data communication with each other in synchronization with a system clock signal WCK. In order to perform the data communication, the external apparatus 110 may provide various control signals that are required for the semiconductor apparatus 120 to operate. The external apparatus 110 may include various types of devices. For example, the external apparatus 110 may be a host device, such as a central processing unit (CPU), a graphic processing unit (GPU), a multi-media processor (MMP), a digital signal processor, an application processor (AP) and a memory controller. For example, the semiconductor apparatus 120 may be a memory device and the memory device may include a volatile memory and a non-volatile memory. The volatile memory may include a static random access memory (static RAM: SRAM), a dynamic RAM (DRAM) and a synchronous DRAM (SDRAM). The non-volatile memory may include a read only memory (ROM), a programmable ROM (PROM), an electrically erasable and programmable ROM (EEPROM), an electrically programmable ROM (EPROM), a flash memory, a phase change RAM (PRAM), a magnetic RAM (MRAM), a resistive RAM (RRAM), a ferroelectric RAM (FRAM) and so forth.

The semiconductor apparatus 120 may be coupled to the external apparatus 110 through a plurality of buses. Each of the buses may be a signal transmission path, a link, or a channel for transferring a signal. Each of the plurality of buses may include a plurality of transmission lines. The plurality of buses may include a dock bus 101, a data bus 102, a strobe bus 103 and so forth. The dock bus 101 may be a unidirectional bus from the external apparatus 110 to the semiconductor apparatus 120. The strobe bus 103 may be a unidirectional bus from the semiconductor apparatus 120 to the external apparatus 110. The data bus 102 may be a bidirectional bus between the external apparatus 110 and the semiconductor apparatus 120. The semiconductor apparatus 120 may be coupled to the external apparatus 110 through the clock bus 101 and may receive the system clock signal WCK through the clock bus 101. The system clock signal WCK may include one or more pairs of clock signals. In an embodiment, the clock bus 101 may include at least two (2) clock transmission lines and may transfer, through the two (2) clock transmission lines, the system clock signal WCK and its complementary signal as a pair of clock signals and/or differential clock signals. The system clock signal WCK may swing within a reduced swing range or may swing to a current mode logic (CML) level.

The semiconductor apparatus 120 may be coupled to the external apparatus 110 through the data bus 102. The semiconductor apparatus 120 may provide data DQ<0:n> to the external apparatus 110 or receive data DQ<0:n> from the external apparatus 110, through the data bus 102, 'n' being an integer equal to or greater than two (2), In synchronization with the system clock signal WCK, the external apparatus 110 may provide the semiconductor apparatus 120 with the data DQ<0:n>. The data bus 102 may include a plurality of data transmission lines and may transfer a plurality of data signals of the data DQ<0:n> through the respective data transmission lines.

The semiconductor apparatus 120 may be coupled to the external apparatus 110 through the strobe bus 103 and may provide the external apparatus 110 with a data output dock signal RCK as a strobe signal through the strobe bus 103, In an embodiment, the strobe bus 103 may include at least two (2) strobe transmission lines and may transfer, through the two (2) strobe transmission lines, the data output dock signal RCK and its complementary signal as a pair of dock signals and/or differential dock signals. In an embodiment, an operation in which the semiconductor apparatus 120 receives data from the external apparatus 110 may be referred to as a write operation and an operation in which the semiconductor apparatus 120 provides the external apparatus 110 with data may be referred to as a read operation, Therefore, the data output dock signal RCK may be referred to as a read dock signal. In synchronization with the data output clock signal RCK or the read dock signal, the semiconductor apparatus 120 may provide the external apparatus 110 with the data DQ<0:n>. The data output dock signal RCK or the read dock signal may have a phase that is synchronized with the system clock signal WCK. Although not illustrated, the semiconductor apparatus 120 may be coupled to the external apparatus 110 through a command bus and an address bus. Each of the command bus and the address bus may be a unidirectional bus from the external apparatus 110 to the semiconductor apparatus 120. The external apparatus 110 may provide the semiconductor apparatus 120 with a command signal through the command bus and with an address signal through the address bus. In synchronization with the system dock signal WCK, the external apparatus 110 may provide the semiconductor apparatus 120 with the command signal and the address signal. In synchronization with the system clock signal WCK, the semiconductor apparatus 120 may receive the command signal and the address signal from the external apparatus 110.

The external apparatus 110 may include a clock generating circuit 111 and a data input/output circuit block 112, The clock generating circuit 111 may generate the system clock signal WCK. The clock generating circuit 111 may include an oscillating circuit, a phase locked loop circuit, and so forth to generate the system clock signal WCK, which periodically toggles. Through the clock bus 101, the clock generating circuit 111 may provide the semiconductor apparatus 120 with the system clock signal WCK. The data input/output circuit block 112 may receive the system clock signal WCK from the clock generating circuit 111. The data input/output circuit block 112 may be coupled to the data bus 102 to provide the semiconductor apparatus 120 with the data DQ<0:n> and may receive the data DQ<0:n> from the semiconductor apparatus 120. The data input/output circuit block 112 may be coupled to the strobe bus 103 to receive the system clock signal WCK from the semiconductor apparatus 120, In synchronization with the system dock signal WCK, the data input/output circuit block 112 may provide the semiconductor apparatus 120 with the data DQ<0:n>. In synchronization with the data output dock signal RCK, the data input/output circuit block 112 may receive the data DQ<0:n> from the semiconductor apparatus 120. The data input/output circuit block 112 may include a plurality of data input/output circuits. The plurality of data input/output circuits may be coupled to the respective data transmission lines of the data bus 102 on a one-on-one basis.

The semiconductor apparatus 120 may include a clock distribution network 121, a data input/output circuit block 122, and a read clock output circuit 123. The clock distribution network 121 may be coupled to the clock bus 101 and may receive, through the clock bus 101, the system clock signal WCK from the external apparatus 110. The clock distribution network 121 may generate, from the system clock signal WCK, the data output clock signal RCK and a data input clock signal ICK and may distribute the data output clock signal RCK and the data input clock signal ICK to the data input/output circuit block 122 and the read clock output circuit 123. The data input clock signal ICK may be referred to as a write clock signal. Each of the data input clock signal ICK and the data output clock signal RCK may have a phase that is synchronized with the system clock signal WCK, In order to generate the data output clock signal RCK and the data input clock signal ICK, the clock distribution network 121 may perform two (2) clock signaling operations of different manners. For example, the clock distribution network 121 may signal the system clock signal WCK to a complementary metal oxide semiconductor (CMOS) level to generate the data output dock signal RCK. The dock distribution network 121 may signal the system dock signal WCK to a current mode logic (CML) level to generate the data input clock signal ICK.

The dock distribution network 121 may include a global dock tree 121-1 and a local dock tree block 121-2. The global dock tree 121-1 may be coupled to the clock bus 101 and may receive the system dock signal WCK. The global dock tree 121-1 may generate, from the system clock signal WCK, at least one of a first distribution dock signal DCK_CMOS and a second distribution clock signal DCK_CML. The swing range of the first distribution clock signal DCK_CMOS may be different from the swing range of the second distribution clock signal DCK_CML. For example, the first distribution dock signal DCK_CMOS may swing to a CMOS level, and the second distribution dock signal DCK_CML may swing to a CML level. The signal swinging to the CMOS level may fully swing and the signal swinging to the CML level may swing within a reduced swing range. Therefore, the second distribution clock signal DCK_CML may swing within a smaller range than the first distribution clock signal DCK_CMOS. The global clock tree 121-1 and the local clock tree block 121-2 may be coupled to each other through at least a first clock transmission line CL1 and a second clock transmission line CL2. The global clock tree 121-1 may provide the local clock tree block 121-2 with the first distribution clock signal DCK_CMOS through the first clock transmission line CL1 and with the second distribution clock signal DCK_CML through the second dock transmission line CL2.

The local dock tree block 121-2 may receive the first distribution dock signal DCK_CMOS through the first dock transmission line CL1 and the second distribution dock signal DCK_CML through the second dock transmission line CL2. Based on the first distribution dock signal DCK_CMOS and the second distribution dock signal DCK_CML, the local clock tree block 121-2 may generate the data output dock signal RCK and the data input clock signal ICK. The local dock tree block 121-2 may drive the first distribution dock signal DCK_CMOS, which swings to the CMOS level, to generate the data output clock signal RCK. The local dock tree block 121-2 may convert the second distribution clock signal DCK_CML, which swings to the CML level, to a signal swinging to the CMOS level and may drive the converted signal to generate the data input clock signal ICK, In an embodiment, the local clock tree block 121-2 may generate the data output clock signal RCK from one of the first distribution clock signal DCK_CMOS and the second distribution clock signal DCK_CML according to at least one of a type of operation that the semiconductor apparatus 120 performs, a frequency mode, and a voltage mode. The local clock tree block 121-2 may generate the data input clock signal ICK from one of the first distribution clock signal DCK_CMOS and the second distribution clock signal DCK_CML according to at least a part of the type of operation that the semiconductor apparatus 120 performs, the frequency mode and the voltage mode. The frequency mode and the voltage mode will be described later.

The data input/output circuit block 122 may receive the data output clock signal RCK and the data input clock signal ICK from the local dock tree block 121-2. The data input/output circuit block 122 may output the data DQ<0:n> according to the data output dock signal RCK. In synchronization with the data output clock signal RCK, the data input/output circuit block 122 may provide the external apparatus 110 with the data DQ<0:n> through the data bus 102. The data input/output circuit block 122 may receive the data DQ<0:n> according to the data input dock signal ICK. In synchronization with the data input dock signal ICK, the data input/output circuit block 122 may receive the data DQ<0:n> from the external apparatus 110 through the data bus 102. The data input/output circuit block 122 may include a plurality of data input/output circuits. The plurality of data input/output circuits may be coupled to the respective data transmission lines of the data bus 102 on a one-on-one basis.

Figure 2:
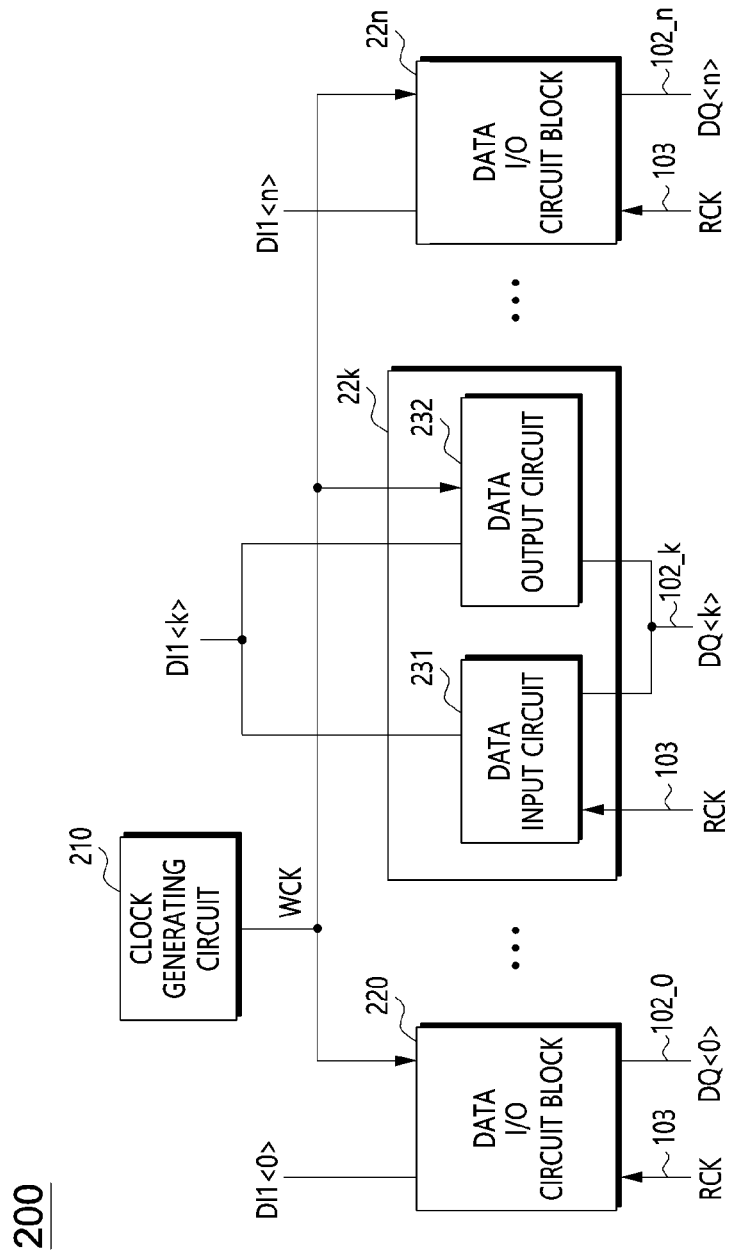
FIG. 2 is a diagram illustrating at least a part of configuration of an external apparatus in accordance with an embodiment.

The read dock output circuit 123 may receive the data output clock signal RCK from the local clock tree block 121-2 and may output the data output clock signal RCK to the external apparatus 110. The read clock output circuit 123 may drive the data output clock signal RCK and may provide the external apparatus 110 with the data output clock signal RCK through the strobe bus 103. The data DQ<0:n> that are transferred from the data input/output circuit block 122 to the external apparatus 110 may be synchronized with the data output clock signal RCK that is transferred through the strobe bus 103, FIG. 2 is a diagram illustrating at least a part of configuration of an external apparatus 200 in accordance with an embodiment. The external apparatus 200 may be embodied as the external apparatus 110, illustrated in FIG. 1. Referring to FIG. 2, the external apparatus 200 may include a dock generating circuit 210 and a plurality of data input/output circuits 220 to 22n. The dock generating circuit 210 may generate the system clock signal WCK and may distribute the system dock signal WCK to the plurality of data input/ output circuits 220 to 22n.

The plurality of data input/output circuits 220 to 22n may receive the system clock signal WCK that is distributed from the clock generating circuit 210. The plurality of data input/output circuits 220 to 22n may receive internal data signals DI1<0:n> of the external apparatus 200, respectively. The plurality of data input/output circuits 220 to 22n may be coupled to the respective data transmission lines 102_0 to 102_n of the data bus 102 of FIG. 1, Each of the plurality of data input/output circuits 220 to 22n may be coupled to the strobe bus 103, illustrated in FIG. 1, to receive the data output clock signal RCK. In synchronization with the system clock signal WCK, the plurality of data input/output circuits 220 to 22n may output, as the data DQ<0:n>, the internal data signals DI1<0:n> of the external apparatus 200, respectively. In synchronization with the data output clock signal RCK, the plurality of data input/output circuits 220 to 22n may receive the data DQ<0:n> that are transferred through the data transmission lines 102_0 to 102_n and may generate the internal data signals DI1<0:n> from the received data DQ<0:n>. Representatively, the data input/output circuit 22k may include a data input circuit 231 and a data output circuit 232, 'k' being an integer between zero (0) to 'n'. The data input circuit 231 may be coupled to the data transmission line 102_k and the strobe bus 103 and may receive the data DQ<k> that are transferred through the data transmission line 102_k and the data output dock signal RCK that is transferred as a strobe signal through the strobe bus 103. In synchronization with the data output dock signal RCK, the data input circuit 231 may receive the data DQ<k> and may output the received DQ<k> as the internal data DI1<k>. The data output circuit 232 may receive the system dock signal WCK from the dock generating circuit 210. The data output circuit 232 may be coupled to the data transmission line 102_k and may provide the data DQ<k> through the data transmission line 102_k. In synchronization with the system dock signal WCK, the data output circuit 232 may drive, based on the internal data DI1<1>, the data transmission line 102_k to output the data DQ<k>.

Figure 3:
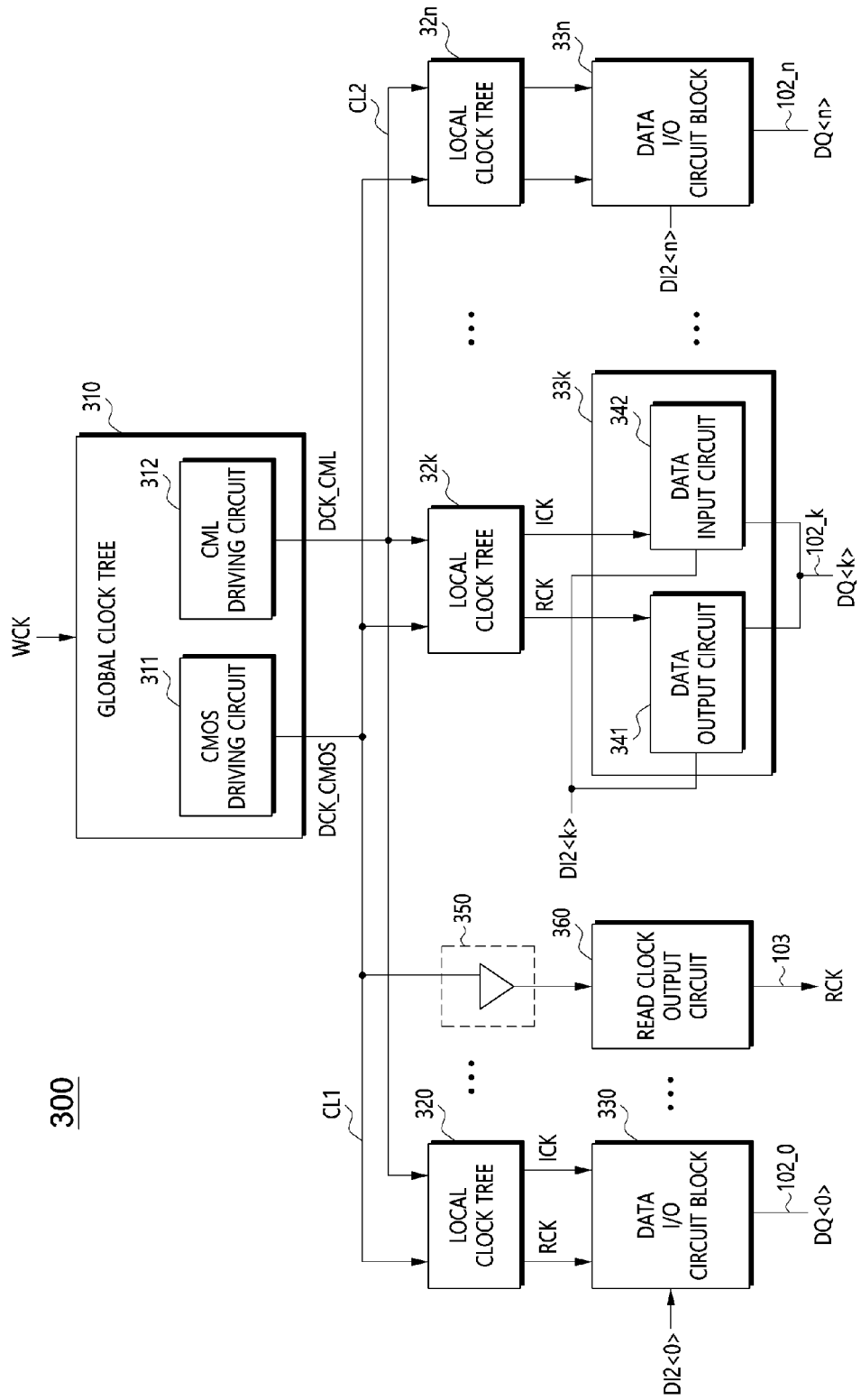
FIG. 3 is a diagram illustrating at least a part of configuration of a semiconductor apparatus in accordance with an embodiment.

FIG. 3 is a diagram illustrating at least a part of configuration of a semiconductor apparatus 300 in accordance with an embodiment. The semiconductor apparatus 300 may be embodied as the semiconductor apparatus 120, illustrated in FIG. 1. Referring to FIG. 3, the semiconductor apparatus 300 may include a global dock tree 310, a plurality of local dock trees 320 to 32n and a plurality of data input/output circuits 330 to 33n. The global dock tree 310 may be coupled to the clock bus 101 of FIG. 1 and may receive the system dock signal WCK through the dock bus 101. Based on the system dock signal WCK, the global clock tree 310 may generate the first distribution dock signal DCK_CMOS and the second distribution dock signal DCK_CML. The global dock tree 310 may provide the first distribution dock signal DCK_CMOS through the first dock transmission line CL1 and may provide the second distribution dock signal DCK_CML through the second clock transmission line CL2. The global clock tree 310 may drive the system dock signal WCK to the CAMS level to generate the first distribution clock signal DCK_CMOS and may drive the system clock signal WCK to the CML level to generate the second distribution clock signal DCK_CML. Therefore, the first clock transmission line CL1 may transfer the first distribution dock signal DCK_CMOS swinging to the CMOS level, and the second clock transmission line CL2 may transfer the second distribution clock signal DCK_CML swinging to the CML level. The global clock tree 310 may include a CMOS driving circuit 311 and a CML driving circuit 312, The CMOS driving circuit 311 may drive the system clock signal WCK to the CMOS level to generate the first distribution clock signal DCK_CMOS. The CML driving circuit 312 may drive the system clock signal WCK to the CML level to generate the second distribution clock signal DCK_CML. The CMOS driving circuit 311 may distribute, through the first clock transmission line CL1, the first distribution clock signal DCK_CMOS to the plurality of local clock trees 320 to 32n. The CML driving circuit 312 may distribute, through the second clock transmission line CL2, the second distribution clock signal DCK_CML to the plurality of local clock trees 320 to 32n.

Each of the plurality of local dock trees 320 to 32n may be coupled to the global clock tree 310 through the first transmission line CL1 and the second dock transmission line CL2 and may receive the first distribution dock signal DCK_CMOS and the second distribution clock signal DCK_ CML from the global clock tree 310 through the first transmission line CL1 and the second dock transmission line CL2. A number of the plurality of local dock trees 320 to 32n may be the same as a number of the plurality of data input/output circuits 330 to 33n. The plurality of local clock trees 320 to 32n may be coupled to the respective data input/output circuits 330 to 33n on a one-on-one basis. In an embodiment, the number of the plurality of local clock trees within the semiconductor apparatus 300 may be less than the number of the plurality of data input/output circuits. In this case, a single local clock tree may be commonly coupled to two (2) or more data input/output circuits. Each of the plurality of local clock trees 320 to 32n may generate the data output clock signal RCK from the first distribution clock signal DCK_CMOS and may generate the data input clock signal ICK from the second distribution clock signal DCK_CML. In an embodiment, each of the plurality of local clock trees 320 to 32n may generate the data output clock signal RCK from one of the first distribution clock signal DCK_CMOS and the second distribution clock signal DCK_ CML and may generate the data input clock signal ICK from one of the first distribution clock signal DCK_CMOS and the second distribution clock signal DCK_CML, according to at least one of a type of operation that the semiconductor apparatus 300 performs, a frequency mode and a voltage mode.

The plurality of data input/output circuits 330 to 33n may be respectively coupled to the plurality of data transmission lines 102_0 to 102_n of the data bus 102 of FIG. 1, According to the first distribution clock signal DCK_CMOS, the plurality of data input/output circuits 330 to 33n may output internal data signals DI2<0:n> of the semiconductor apparatus 300 as the data DQ<0:n> through the data transmission lines 102_0 to 102_n, respectively. According to the second distribution clock signal DCK_CML, the plurality of data input/output circuits 330 to 33n may receive the data DQ<0:n> from the external apparatus 200 of FIG. 1 through the data transmission lines 102_0 to 102_n, respectively. The plurality of data input/output circuits 330 to 33n may receive the data output clock signal RCK and the data input clock signal ICK from the plurality of local clock trees 320 to 32n, respectively. According to the data output clock signal RCK, the plurality of data input/output circuits 330 to 33n may respectively output the internal data signals DI2<0:n> of the semiconductor apparatus 300 as the data DQ<0:n>. According to the data input clock signal ICK, the plurality of data input/output circuits 330 to 33n may receive the data DQ<0:n> from the external apparatus 200 and may generate the internal data signals DI2<0:n> of the semiconductor apparatus 300 based on the received data DQ<0:n>, respectively.

Representatively, the data input/output circuit 33k may include a data output circuit 341 and a data input circuit 342. The data output circuit 341 and the data input circuit 342 may be commonly coupled to the data transmission line 102_k. The data output circuit 341 may receive the data output dock signal RCK from the local dock tree 32k. The data input circuit 342 may receive the data input dock signal ICK from the local clock tree 32k. The data output circuit 341 may receive the internal data signal DI2<k> of the semiconductor apparatus 300. In synchronization with the data output clock signal RCK, the data output circuit 341 may provide the internal data signal DI2<k> as the data DQ<k> through the data transmission line 102_k. In synchronization with the data input clock signal ICK, the data input circuit 342 may receive the data DQ<k> that are transferred through the data transmission line 102_k. The data input circuit 342 may generate the internal data signal DI2<k> of the semiconductor apparatus 300 based on the received data DQ<k>.

The semiconductor apparatus 300 may further include a local clock tree 350 and a read clock output circuit 360. The local clock tree 350 may be coupled to the first clock transmission line CL1 and may receive the first distribution clock signal DCK_CMOS from the global clock tree 310 through the first clock transmission line CL1. The local clock tree 350 may drive the first distribution clock signal DCK_CMOS to generate the data output clock signal RCK. In an embodiment, the local clock tree 350 may be also coupled to the second clock transmission line CL2 and may receive both the first distribution clock signal DCK_CMOS and the second distribution clock signal DCK_CML. According to at least one of the frequency mode and the voltage mode, the local dock tree 350 may drive one of the first distribution dock signal DCK_CMOS and the second distribution dock signal DCK_CML to generate the data output clock signal RCK. The read dock output circuit 360 may be coupled to the strobe bus 103 of FIG. 1 and may receive the data output dock signal RCK from the local dock tree 350. The read clock output circuit 360 may provide the external apparatus 200 with the data output clock signal RCK through the strobe bus 103. The data output clock signal RCK that is provided from the read clock output circuit 360 through the strobe bus 103 may be synchronized with the data DQ<0:n> that are output from the plurality of data input/output circuits 330 to 33n through the data transmission lines 1020 to 102k.

Referring to FIGS. 2 and 3, the external apparatus 200 may provide the semiconductor apparatus 300 with the system clock signal WCK. The global clock tree 310 may drive the system clock signal WCK to the CMOS level to generate the first distribution clock signal DCK_CMOS and may drive the system clock signal WCK to the CML level to generate the second distribution clock signal DCK_CML. 21; During a write operation, the external apparatus 200 may be synchronized with the system clock signal WCK to provide the semiconductor apparatus 300 with the data DQ<0:n>. The semiconductor apparatus 300 should receive data from the external apparatus 200 according to the clock signal that is generated from the global dock tree 310 and the plurality of local clock trees 320 to 32n. Therefore, despite the high power consumption, it is desirable to generate the data input clock signal ICK based on the second distribution dock signal DCK_CML having the strong noise-immunity. Accordingly, the plurality of local dock trees 320 to 32n may generate the data input dock signal ICK based on the second distribution dock signal DCK_CML, and the plurality of data input/output circuits 330 to 33n may be synchronized with the data input dock signal ICK that is generated from the second distribution dock signal DCK_CML to receive the data DQ<0:n> from the external apparatus 200. During a read operation, the semiconductor apparatus 300 may provide the external apparatus 200 with the data DQ<0:n> based on the internal data signal DI2<0:n> of the semiconductor apparatus 300. Both the data DQ<0:n> and the data output clock signal RCK may be generated within the semiconductor apparatus 300 during a read operation, and thus, a noise that can occur within the global clock tree 310 may be a common mode noise that can be removed. Therefore, despite the weak noise-immunity, it is desirable to generate the data output clock signal RCK based on the first distribution clock signal DCK_CMOS that results in lower power consumption for the semiconductor apparatus 300. Accordingly, the plurality of local clock trees 320 to 32n may respectively generate the data output clock signal RCK based on the first distribution clock signal DCK_CMOS, and the plurality of data input/output circuits 330 to 33n may be synchronized with the data output clock signal RCK that is generated from the first distribution clock signal DCK_CMOS to provide the external apparatus 200 with the data DQ<0:n>, respectively.

Figure 4:
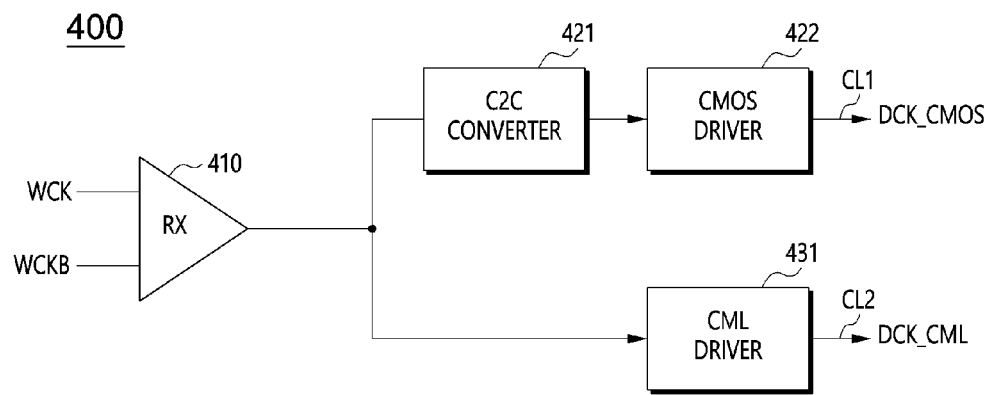
FIG. 4 is a diagram illustrating a configuration of a global clock tree in accordance with an embodiment.

FIG. 4 is a diagram illustrating a configuration of a global clock tree 400 in accordance with an embodiment. The global clock tree 400 may be embodied as each of the global clock trees 121-1 and 310, respectively illustrated in FIGS. 1 and 3, Referring to FIG. 4, the global clock tree 400 may include a clock receiver 410, a CML-CMOS (C2C) converter 421, a CMOS driver 422, and a CML driver 431. The clock receiver 410 may receive the system clock signal WCK. The system clock signal WCK may be transferred as a differential signal, and the clock receiver 410 may differentially amplify the system clock signal WCK and its complementary signal WCKB to receive the system clock signal WCK. The system clock signal WCK, provided to the clock receiver 410, may swing to the CML level. The CML-CMOS converter 421 may receive the system clock signal WCK from the clock receiver 410 and may convert the system clock signal WCK to a signal that swings to the CMOS level. The CMOS driver 422 may receive the output signal from the CML-CMOS converter 421 and may drive the output signal from the CML-CMOS converter 421 to the CMOS level to generate the first distribution clock signal DCK_CMOS. The first distribution clock signal DCK_CMOS may swing to the CMOS level and may be transferred as a signal having the CMOS level through the first clock transmission line CL1, The CML driver 431 may receive the system clock signal WCK from the clock receiver 410. The CML driver 431 may drive the system clock signal WCK to the CML level to generate the second distribution clock signal DCK_CML, The second distribution dock signal DCK_CML may swing to the CML level and may be transferred as a signal having the CML level through the second dock transmission line CL2.

Figure 5:
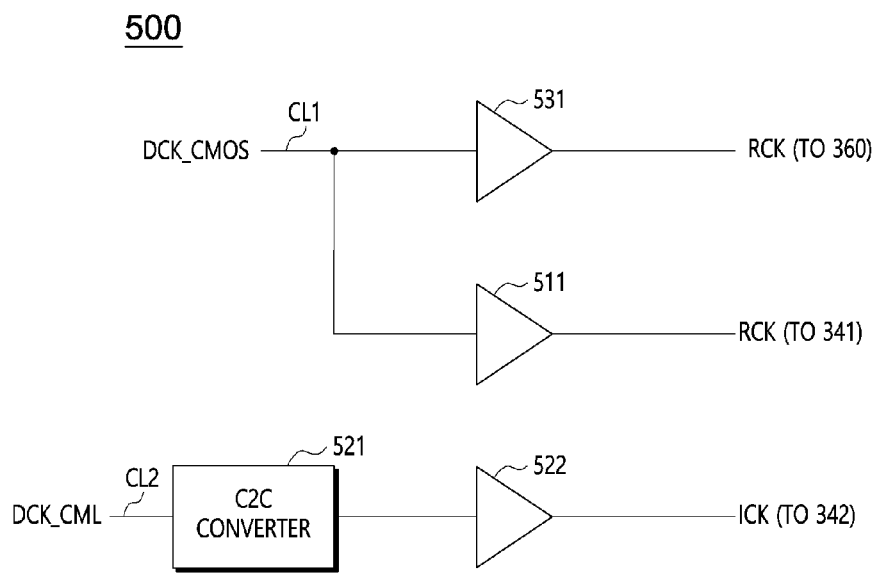
FIG. 5 is a diagram illustrating a configuration of a local clock tree in accordance with an embodiment.
Figure 6:
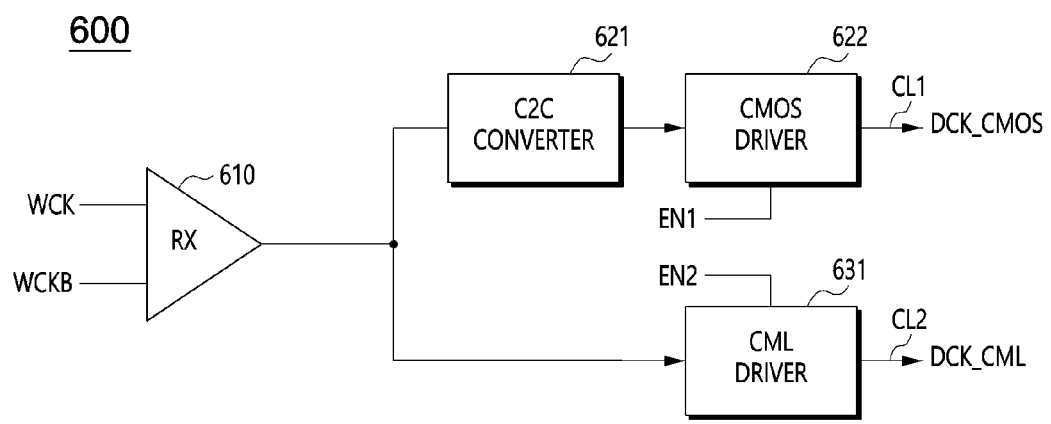
FIG. 6 is a diagram illustrating a configuration of a global clock tree in accordance with an embodiment.

FIG. 5 is a diagram illustrating a configuration of a local dock tree 500 in accordance with an embodiment. The local dock tree 500 may be embodied as each of the plurality of local dock trees 320 to 32n that is coupled to the data input/output circuits 330 to 33n, illustrated in FIG. 3. Referring to FIG. 5, the local clock tree 500 may include a first driver 511, a CML-CMOS (C2C) converter 521, and a second driver 522. The first driver 511 may be coupled to the first clock transmission line CL1 and may receive the first distribution clock signal DCK_CMOS. The first driver 511 may drive the first distribution clock signal DCK_CMOS to generate the data output clock signal RCK. The first driver 511 may output the data output clock signal RCK to the data output circuit (e.g., the data output circuit 341 within the data input/output circuit 33k illustrated in FIG. 3) that is coupled to the local clock tree 500, The CML-CMOS converter 521 may be coupled to the second clock transmission line CL2 and may receive the second distribution clock signal DCK_CML. The CML-CMOS converter 521 may convert the second distribution clock signal DCK_CML swinging to the CML level to a signal swinging to the CMOS level. The second driver 522 may receive the output signal from the CML-CMOS converter 521, The second driver 522 may drive the output signal from the CML-CMOS converter 521 to generate the data input clock signal ICK. The second driver 522 may output the data input clock signal ICK to the data input circuit (e.g., the data input circuit 342 within the data input/output circuit 33k illustrated in FIG. 3) that is coupled to the local dock tree 500, The local clock tree 500 may further include a third driver 531, The third driver 531 may be coupled to the first clock transmission line CL1 and may receive the first distribution clock signal DCK_CMOS. The third driver 531 may drive the first distribution clock signal DCK_CMOS to generate the data output clock signal RCK. The third driver 531 may output the data output clock signal RCK to the read clock output circuit (e.g., the read clock output circuit 360 illustrated in FIG. 3) that is coupled to the local clock tree 500. The data output clock signal RCK that is output from the third driver 531 may be transferred as a strobe signal through the strobe bus 103, FIG. 6 is a diagram illustrating a configuration of a global clock tree 600 in accordance with an embodiment. The global clock tree 600 may be embodied as each of the global clock trees 121-1 and 310, respectively illustrated in FIGS. 1 and 3. Referring to FIG. 6, the global clock tree 600 may include a clock receiver 610, a CML-CMOS (C2C) converter 621, a CMOS driver 622, and a CML driver 631. The clock receiver 610 may receive the system clock signal WCK. The system clock signal WCK may be transferred as a differential signal, and the clock receiver 610 may differentially amplify the system clock signal WCK and its complementary signal WCKB to receive the system clock signal WCK. The system clock signal WCK that Is provided to the clock receiver 610 may swing to the CML level. The CML-CMOS converter 621 may receive the system clock signal WCK from the clock receiver 610 and may convert the system dock signal WCK to a signal swinging to the CMOS level. The CMOS driver 622 may receive the output signal from the CML-CMOS converter 621 and may drive the output signal from the CML-CMOS converter 621 to the CMOS level to generate the first distribution clock signal DCK_CMOS. The first distribution clock signal DCK_CMOS may swing to the CMOS level and may be transferred as a signal having the CMOS level through the first clock transmission line CL1, The CML driver 631 may receive the system clock signal WCK from the clock receiver 610. The CML driver 631 may drive the system clock signal WCK to the CML level to generate the second distribution clock signal DCK_CML, The second distribution clock signal DCK_CML may swing to the CML level and may be transferred as a signal having the CML level through the second clock transmission line CL2.

The CMOS driver 622 may receive a first enable signal EN1 and may be selectively activated according to the first enable signal EN1, For example, the CMOS driver 622 may be activated when the first enable signal EN1 is enabled and may be deactivated when the first enable signal EN1 is disabled. The CML driver 631 may receive a second enable signal EN2 and may be selectively activated according to the second enable signal EN2, For example, the CML driver 631 may be activated when the second enable signal EN2 is enabled and may be deactivated when the second enable signal EN2 is disabled.

As shown in the table 1, each of the first enable signal EN1 and the second enable signal EN2 may be selectively enabled according to a mode of the semiconductor apparatus 300.

TABLE 1

| READ | WRITE | EN1 | EN2 |
| --- | --- | --- | --- |
| ○ | X | Enable | Disable |
| X | ○ | Disable | Enable |

Referring to FIGS. 2, 3, and 6, the "READ" field may represent a read operation in which the semiconductor apparatus 300 outputs data to the external apparatus 200, and the "WRITE" field may represent a write operation in which the semiconductor apparatus 300 receives data from the external apparatus 200. During the read operation, the first enable signal EN1 may be enabled, and the second enable signal EN2 may be disabled. Accordingly, the CMOS driver 622 may be activated to generate the first distribution clock signal DCK_CMOS, and the CML driver 631 may be deactivated to not generate the second distribution clock signal DCK_CML. During the write operation, the second enable signal EN2 may be enabled, and the first enable signal EN1 may be disabled. Accordingly, the CML driver 631 may be activated to generate the second distribution clock signal DCK_CML, and the CMOS driver 622 may be deactivated to not generate the first distribution clock signal DCK_CMOS.

In an embodiment, each of the first enable signal EN1 and the second enable signal EN2 may be selectively enabled according to a mode of the semiconductor apparatus 300, as shown in the table 2.

TABLE 2

| READ | WRITE | FM | EN1 | EN2 |
| --- | --- | --- | --- | --- |
| ○ | X | Enable | Enable or Disable | Disable or Enable |
| ○ | X | Disable | Enable | Disable |
| X | ○ | Enable | Disable | Enable |
| X | ○ | Disable | Disable or Enable | Enable or Disable |

The "FM" field may represent the frequency mode. The frequency mode FM may include information about whether the system dock signal WCK has a higher or lower frequency than a reference frequency. When the system clock signal WCK has a higher frequency than the reference frequency, the semiconductor apparatus 300 may be determined as performing a high-speed operation, and the frequency mode FM may be enabled. When the system clock signal WCK has a lower frequency than the reference frequency, the semiconductor apparatus 300 may be determined as performing a low-speed operation, and the frequency mode FM may be disabled.

When the semiconductor apparatus 300 performs the read operation and the frequency mode FM is enabled, the first enable signal EN1 may be enabled, and the second enable signal EN2 may be disabled. Accordingly, the CMOS driver 622 may be activated to generate the first distribution clock signal DCK_CMOS, the CML driver 631 may be deactivated to not generate the second distribution clock signal DCK_CML, and the semiconductor apparatus 300 may perform the read operation according to the first distribution clock signal DCK_CMOS. Alternatively, the first enable signal EN1 may be disabled, and the second enable signal EN2 may be enabled. Accordingly, the CMOS driver 622 may be deactivated to not generate the first distribution dock signal DCK_CMOS, and the CML driver 631 may be activated to generate the second distribution clock signal DCK_CML, The semiconductor apparatus 300 may perform the read operation according to the second distribution dock signal DCK_CML in consideration of the high-speed operation of the semiconductor apparatus 300 despite the read operation.

When the semiconductor apparatus 300 performs the read operation and the frequency mode FM is disabled, the first enable signal EN1 may be enabled, and the second enable signal EN2 may be disabled. Accordingly, the CMOS driver 622 may be activated to generate the first distribution clock signal DCK_CMOS, the CML driver 631 may be deactivated to not generate the second distribution clock signal DCK_CML, and the semiconductor apparatus 300 may perform the read operation according to the first distribution clock signal DCK_CMOS.

When the semiconductor apparatus 300 performs the write operation and the frequency mode FM is enabled, the second enable signal EN2 may be enabled and the first enable signal EN1 may be disabled. Accordingly, the CML driver 631 may be activated to generate the second distribution clock signal DCK_CML, the CMOS driver 622 may be deactivated to not generate the first distribution clock signal DCK_CMOS and the semiconductor apparatus 300 may perform the write operation according to the second distribution clock signal DCK_CML.

When the semiconductor apparatus 300 performs the write operation and the frequency mode FM is disabled, the second enable signal EN2 may be enabled, and the first enable signal EN1 may be disabled. Accordingly, the CML driver 631 may be activated to generate the second distribution dock signal DCK_CML, the CMOS driver 622 may be deactivated to not generate the first distribution dock signal DCK_CMOS, and the semiconductor apparatus 300 may perform the write operation according to the second distribution dock signal DCK_CML, Alternatively, the first enable signal EN1 may be enabled, and the second enable signal EN2 may be disabled. Accordingly, the CMOS driver 622 may be activated to generate the first distribution dock signal DCK_CMOS, and the CML driver 631 may be deactivated to not generate the second distribution dock signal DCK_CML The semiconductor apparatus 300 may perform the write operation according to the first distribution dock signal DCK_CMOS in consideration of the low-speed operation of the semiconductor apparatus 300 despite the write operation.

In an embodiment, each of the first enable signal EN1 and the second enable signal EN2 may be selectively enabled according to a mode of the semiconductor apparatus 300, as shown in the table 3.

TABLE 3

| READ | WRITE | FM | VM | EN1 | EN2 |
|------|-------|----|----|-----|-----|
| ○ | X | Enable | Disable | Disable | Enable |
| ○ | X | Enable | Enable | Enable | Disable |
| ○ | X | Disable | Don't Care | Enable | Disable |
| X | ○ | Enable | Don't Care | Disable | Enable |
| X | ○ | Disable | Disable | Disable | Enable |
| X | 0 | Disable | Enable | Enable | Disable |

The "VM" field may represent the voltage mode. The voltage mode VM may include information about whether the semiconductor apparatus 300 has a limitation of power consumption. When the semiconductor apparatus 300 has the limitation of power consumption, the voltage mode VM may be enabled. When the semiconductor apparatus 300 does not have the limitation of power consumption, the voltage mode VM may be disabled.

When the semiconductor apparatus 300 performs the read operation, the frequency mode FM being enabled and the voltage mode VM being disabled, the first enable signal EN1 may be disabled, and the second enable signal EN2 may be enabled. Accordingly, the CMOS driver 622 may be deactivated to not generate the first distribution clock signal DCK_CMOS and the CML driver 631 may be activated to generate the second distribution clock signal DCK_CML, The semiconductor apparatus 300 may perform the read operation according to the second distribution clock signal DCK_CML to improve the performance of the semiconductor apparatus 300 in consideration of the high-speed operation of the semiconductor apparatus 300.

When the semiconductor apparatus 300 performs the read operation, the frequency mode FM being enabled and the voltage mode VM being disabled, the first enable signal EN1 may be enabled, and the second enable signal EN2 may be disabled. Accordingly, the CMOS driver 622 may be activated to generate the first distribution clock signal DCK_CMOS and the CML driver 631 may be deactivated to not generate the second distribution dock signal DCK_CML. The semiconductor apparatus 300 may perform the read operation according to the first distribution dock signal DCK_CMOS for low power consumption in consideration of the limitation of power consumption of the semiconductor apparatus 300.

When the semiconductor apparatus 300 performs the read operation and the frequency mode FM is disabled, the first enable signal EN1 may be enabled, and the second enable signal EN2 may be disabled, regardless of whether the voltage mode VM is enabled. Accordingly, the CMOS driver 622 may be activated to generate the first distribution clock signal DCK_CMOS, and the CML driver 631 may be deactivated to not generate the second distribution clock signal DCK_CML. The semiconductor apparatus 300 may perform the read operation according to the first distribution clock signal DCK_CMOS.

When the semiconductor apparatus 300 performs the write operation and the frequency mode FM is enabled, the first enable signal EN1 may be disabled, and the second enable signal EN2 may be enabled, regardless of whether the voltage mode VM is enabled. Accordingly, the CMOS driver 622 may be deactivated to not generate the first distribution clock signal DCK_CMOS, and the CML driver 631 may be activated to generate the second distribution clock signal DCK_CML. The semiconductor apparatus 300 may perform the write operation according to the second distribution clock signal DCK_CML.

When the semiconductor apparatus 300 performs the write operation, the frequency mode FM being disabled and the voltage mode VM being disabled, the first enable signal EN1 may be disabled, and the second enable signal EN2 may be enabled. Accordingly, the CMOS driver 622 may be deactivated to not generate the first distribution dock signal DCK_CMOS, and the CML driver 631 may be activated to generate the second distribution clock signal DCK_CML. The semiconductor apparatus 300 may perform the write operation according to the second distribution clock signal DCK_CML to improve the performance of the semiconductor apparatus 300 in consideration of the low-speed operation of the semiconductor apparatus 300.

When the semiconductor apparatus 300 performs the write operation, the frequency mode FM being disabled and the voltage mode VM being enabled, the first enable signal EN1 may be enabled, and the second enable signal EN2 may be disabled. Accordingly, the CMOS driver 622 may be activated to generate the first distribution clock signal DCK_CMOS, and the CML driver 631 may be deactivated to not generate the second distribution dock signal DCK_CML. The semiconductor apparatus 300 may perform the write operation according to the first distribution clock signal DCK_CMOS for low power consumption in consideration of the low power operation of the semiconductor apparatus 300.

Figure 7:
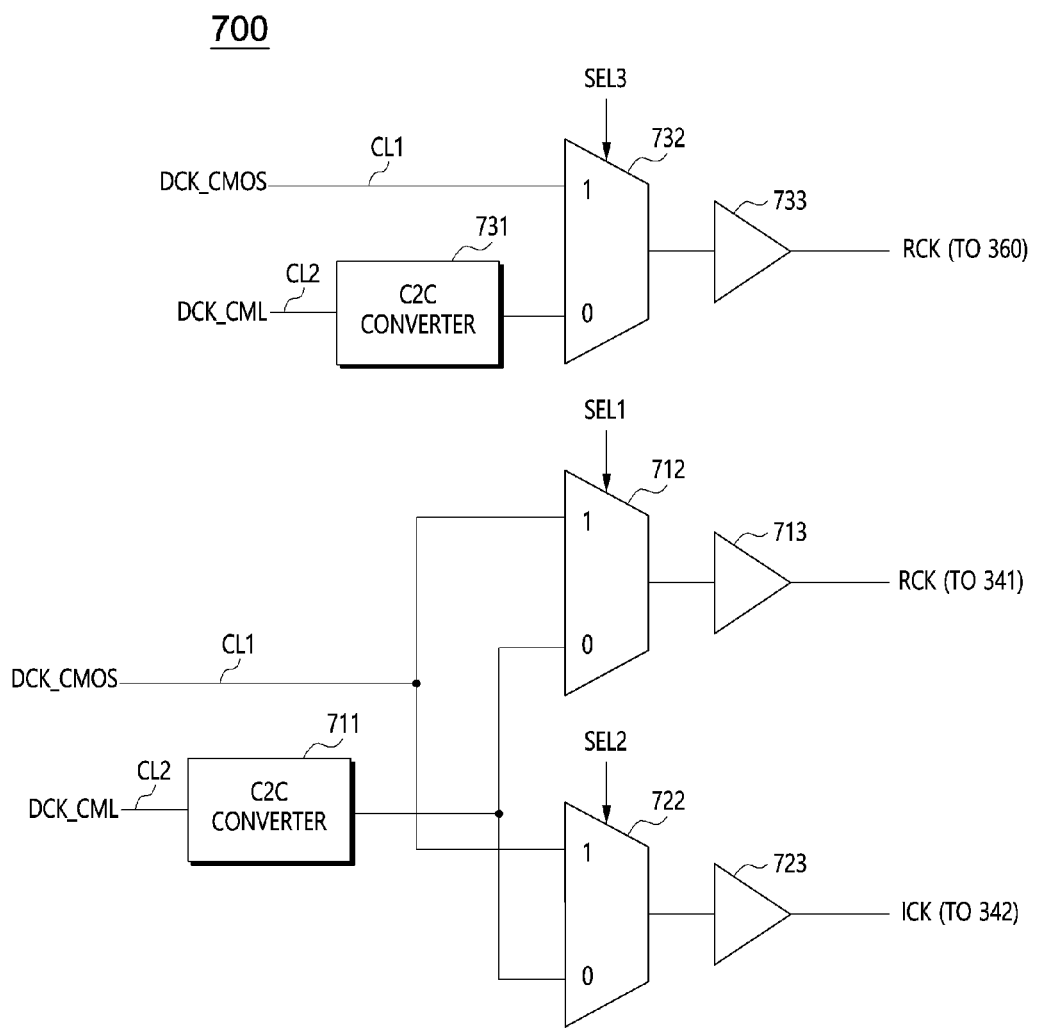
FIG. 7 is a diagram illustrating a configuration of a local clock tree in accordance with an embodiment.

FIG. 7 is a diagram illustrating a configuration of a local clock tree 700 in accordance with an embodiment. The local clock tree 700 may be embodied as each of the plurality of local clock trees 320 to 32n that is coupled to the data input/output circuits 330 to 33n, illustrated in FIG. 3. Referring to FIG. 7, the local clock tree 700 may include a CML-CMOS (C2C) converter 711, a first selection circuit 712, a first driver 713, a second selection circuit 722, and a second driver 723. The CML-CMOS converter 711 may be coupled to the second dock transmission line CL2 and may receive the second distribution dock signal DCK_CML. The CML-CMOS converter 711 may convert the second distribution dock signal DCK_CML swinging to the CML level to a signal swinging to the CMOS level. The first selection circuit 712 may receive the first distribution dock signal DCK_CMOS, the output signal from the CML-CMOS converter 711, and a first selection signal SEL1. According to the first selection signal SEL1 the first selection circuit 712 may output one of the first distribution clock signal DCK_CMOS and the output signal from the CML-CMOS converter 711. For example, the first selection circuit 712 may output the first distribution dock signal DCK_CMOS when the first selection signal SEL1 is enabled and may output the output signal from the CML-CMOS converter 711 when the first selection signal SEL1 is disabled. For example, the first selection signal SEL1 may be enabled to a high logic level and may be disabled to a low logic level. The first driver 713 may receive the output signal from the first selection circuit 712. The first driver 713 may drive the output signal from the first selection circuit 712 to generate the data output clock signal RCK. The first driver 713 may output the data output clock signal RCK to the data output circuit (e.g., the data output circuit 341 within the data input/output circuit 33k illustrated in FIG. 3) that is coupled to the local clock tree 700. The second selection circuit 722 may receive the first distribution clock signal DCK_CMOS, the output signal from the CML-CMOS converter 711, and a second selection signal SEL2. According to the second selection signal SEL2, the second selection circuit 722 may output one of the first distribution clock signal DCK_CMOS and the output signal from the CML-CMOS converter 711, For example, the second selection circuit 722 may output the first distribution clock signal DCK_CMOS when the second selection signal SEL2 is enabled and may output the output signal from the CML-CMOS converter 711 when the second selection signal SEL2 is disabled. For example, the second selection signal SEL2 may be enabled to a high logic level and may be disabled to a low logic level. The second driver 723 may receive the output signal from the second selection circuit 722. The second driver 723 may drive the output signal from the second selection circuit 722 to generate the data input clock signal ICK. The second driver 723 may output the data input clock signal ICK to the data input circuit (e.g., the data input circuit 342 within the data input/output circuit 33k illustrated in FIG. 3) that is coupled to the local clock tree 700.

The local clock tree 700 may further include a CML-CMOS (C2C) converter 731, a third selection circuit 732, and a third driver 733. The CML-CMOS converter 731 may be coupled to the second clock transmission line CL2 and may receive the second distribution clock signal DCK_CML. The CML-CMOS converter 731 may convert the second distribution clock signal DCK_CML swinging to the CML level to a signal swinging to the CMOS level. The third selection circuit 732 may receive the first distribution clock signal DCK_CMOS, the output signal from the CML-CMOS converter 731, and a third selection signal SEL3. According to the third selection signal SEL3, the third selection circuit 732 may output one of the first distribution dock signal DCK_CMOS and the output signal from the CML-CMOS converter 731. For example, the third selection circuit 732 may output the first distribution clock signal DCK_CMOS when the third selection signal SEL3 is enabled and may output the output signal from the CML-CMOS converter 731 when the third selection signal SEL3 is disabled. For example, the third selection signal SEL3 may be enabled to a high logic level and may be disabled to a low logic level. The third driver 733 may receive the output signal from the third selection circuit 732. The third driver 733 may drive the output signal from the third selection circuit 732 to generate the data output dock signal RCK. The third driver 733 may output the data output clock signal RCK to the read dock output circuit (e.g., the read clock output circuit 360 illustrated in FIG. 3) that is coupled to the local clock tree 700.

When the local clock tree 700 is coupled to the global clock tree 600, illustrated in FIG. 6, and operates, each of the first to third selection signals SEL1, SEL2, and SEL3 may be selectively enabled according to a mode of the semiconductor apparatus 300, as shown in table 4.

TABLE 4

| READ | WRITE | SEL1 | SEL2 | SEL3 |
|---|---|---|---|---|
| ○ | X | Enable | Disable | Enable |
| X | ○ | Enable | Disable | Enable |

Referring to FIGS. 2, 3 and 7, during the read operation of the semiconductor apparatus 300, the global dock tree 600 may generate the first distribution dock signal DCK_CMOS and might not generate the second distribution clock signal DCK_CML. Further, during the write operation of the semiconductor apparatus 300, the global clock tree 600 might not generate the first distribution dock signal DCK_CMOS and may generate the second distribution clock signal DCK_CML. Therefore, regardless of whether the semiconductor apparatus 300 performs the read operation or the write operation, the first selection signal SEL1 may be enabled, the second selection signal SEL2 may be disabled, and the third selection signal SEL3 may be enabled.

During the read operation of the semiconductor apparatus 300, the first selection circuit 712 may output the first distribution clock signal DCK_CMOS according to the first selection signal SEL1. The first driver 713 may drive the first distribution clock signal DCK_CMOS to generate the data output clock signal RCK and may provide the data output clock signal RCK to the data output circuit 341 within the data input/output circuit 33k coupled to the local clock tree 700. Although the second selection circuit 722 may select the output signal from the CML-CMOS converter 711 according to the second selection signal SEL2, the second distribution clock signal DCK_CML might not be generated and therefore the data input clock signal ICK might not be generated. The third selection circuit 732 may output the first distribution clock signal DCK_CMOS according to the third selection signal SEL3 The third driver 733 may generate the data output clock signal RCK from the first distribution dock signal DCK_CMOS and may provide the data output dock signal RCK to the read dock output circuit 360 such that the data output clock signal RCK is output as a strobe signal.

During the write operation of the semiconductor apparatus 300, the first distribution dock signal DCK_CMOS might not be generated, and therefore, the first driver 713 might not generate the data output clock signal RCK even when the first selection circuit 712 selects the first distribution clock signal DCK_CMOS. According to the second selection signal SEL2, the second selection circuit 722 may output the output signal from the CML-CMOS converter 711, The second driver 723 may receive the output signal from the second selection circuit 722 and may generate the data input clock signal ICK based on the second distribution clock signal DCK_CML, which is transferred while having the CML level. The second driver 723 may provide the data input clock signal ICK to the data input circuit 342 within the data input/output circuit 33k that is coupled to the local clock tree 700. Although the third selection circuit 732 may select the first distribution clock signal DCK_CMOS according to the third selection signal SEL3, the first distribution clock signal DCK_CMOS might not be generated, and therefore, the data output clock signal RCK might not be generated.

In an embodiment, each of the first to third selection signals SEL1, SEL2, and SEL3 may be selectively enabled according to a mode of the semiconductor apparatus 300, as shown in the table 5,

TABLE 5

| READ | WRITE | FM | SEL1 | SEL2 | SEL3 |
|---|---|---|---|---|---|
| ○ | X | Enable | Enable or Disable | Disable or Enable | Enable or Disable |
| ○ | X | Disable | Enable | Disable | Enable |
| X | ○ | Enable | Enable | Disable | Enable |
| X | ○ | Disable | Enable or Disable | Disable or Enable | Enable or Disable |

When the semiconductor apparatus 300 performs the read operation and the frequency mode FM is enabled, the global dock tree 600 may generate the first distribution dock signal DCK_CMOS and might not generate the second distribution dock signal DCK_CML, The first selection signal SEL1 may be enabled, the second selection signal SEL2 may be disabled, and the third selection signal SEL3 may be enabled. The first selection circuit 712 may select the first distribution clock signal DCK_CMOS according to the first selection signal SEL1, and the first driver 713 may generate the data output clock signal RCK based on the first distribution clock signal DCK_CMOS, The first driver 713 may provide the data output clock signal RCK to the data output circuit 341 within the data input/output circuit 33k that is coupled to the local clock tree 700, The second selection circuit 722 may select the output signal from the CML-CMOS converter 711 according to the second selection signal SEL2, and therefore, the second driver 723 might not generate the data input clock signal ICK, The third selection circuit 732 may select the first distribution clock signal DCK_CMOS according to the third selection signal SEL3, and the third driver 733 may generate the data output clock signal RCK based on the first distribution clock signal DCK_CMOS, The third driver 733 may provide the data output dock signal RCK to the read dock output circuit 360, Alternatively, when the global dock tree 600 does not generate the first distribution dock signal DCK_CMOS and generates the second distribution dock signal DCK_CML, the first selection signal SEL1 may be disabled, the second selection signal SEL2 may be enabled, and the third selection signal SEL3 may be disabled. The first selection circuit 712 may select the output signal from the CML-CMOS converter 711 according to first selection signal SEL1 and the first driver 713 may generate the data output clock signal RCK based on the second distribution clock signal DCK_CML. The second selection circuit 722 may select the first distribution clock signal DCK_CMOS according to the second selection signal SEL2, and therefore, the second driver 723 might not generate the data input clock signal ICK. The third selection circuit 732 may select the output signal from the CML-CMOS converter 731 according to the third selection signal SEL3, and the third driver 733 may generate the data output clock signal RCK based on the second distribution clock signal DCK_CML.

When the semiconductor apparatus 300 performs the read operation and the frequency mode FM is disabled, the global clock tree 600 may generate the first distribution clock signal DCK_CMOS and might not generate the second distribution clock signal DCK_CML, The first selection signal SEL1 may be enabled, the second selection signal SEL2 may be disabled, and the third selection signal SEL3 may be enabled. The first selection circuit 712 may select the first distribution clock signal DCK_CMOS according to the first selection signal SEL1, and the first driver 713 may generate the data output dock signal RCK based on the first distribution clock signal DCK_CMOS, The second selection circuit 722 may select the output signal from the CML-CMOS converter 711 according to the second selection signal SEL2, and therefore, the second driver 723 might not generate the data input dock signal ICK. The third selection circuit 732 may select the first distribution dock signal DCK_CMOS according to the third selection signal SEL3, and the third driver 733 may generate the data output dock signal RCK based on the first distribution clock signal DCK_CMOS.

When the semiconductor apparatus 300 performs the write operation and the frequency mode FM is enabled, the global clock tree 600 might not generate the first distribution clock signal DCK_CMOS and may generate the second distribution clock signal DCK_CML. The first selection signal SEL1 may be enabled, the second selection signal SEL2 may be disabled, and the third selection signal SEL3 may be enabled. Although the first selection circuit 712 may select the first distribution clock signal DCK_CMOS according to the first selection signal SEL1, the first distribution clock signal DCK_CMOS might not be generated, and therefore, the first driver 713 might not generate the data output clock signal RCK. The second selection circuit 722 may select the second distribution clock signal DCK_CML according to the second selection signal SEL2, and therefore, the second driver 723 may generate the data input clock signal ICK based on the second distribution clock signal DCK_CML. The second driver 723 may provide the data input dock signal ICK to the data input circuit 342 within the data input/output circuit 33k that is coupled to the local dock tree 700, Although the third selection circuit 732 may select the first distribution dock signal DCK_CMOS according to the third selection signal SEL3, the first distribution dock signal DCK_CMOS might not be generated, and therefore, the third driver 733 might not generate the data output dock signal RCK.

When the semiconductor apparatus 300 performs the write operation and the frequency mode FM is disabled, the global dock tree 600 might not generate the first distribution clock signal DCK_CMOS and may generate the second distribution clock signal DCK_CML, The first selection signal SEL1 may be enabled, the second selection signal SEL2 may be disabled, and the third selection signal SEL3 may be enabled. The first selection circuit 712 may select the output signal from the CML_CMOS converter 711, and the third selection circuit 732 may select the output signal from the CML_CMOS converter 731, and therefore, each of the first driver 713 and the third driver 733 might not generate the data output clock signal RCK, The second selection circuit 722 may select the output signal from the CML-CMOS converter 711 according to the second selection signal SEL2, and therefore, the second driver 723 may generate the data input clock signal ICK based on the second distribution clock signal DCK_CML, Alternatively, the global clock tree 600 may generate the first distribution clock signal DCK_CMOS and might not generate the second distribution clock signal DCK_CML. The first selection signal SEL1 may be disabled, the second selection signal SEL2 may be enabled, and the third selection signal SEL3 may be disabled. The first selection circuit 712 may select the output signal from the CML_CMOS converter 711, and the third selection circuit 732 may select the output signal from the CML_CMOS converter 731, and therefore, each of the first driver 713 and the third driver 733 might not generate the data output dock signal RCK. The second selection circuit 722 may select the first distribution clock signal DCK_CMOS according to the second selection signal SEL2, and therefore, the second driver 723 may generate the data input dock signal ICK based on the first distribution dock signal DCK_CMOW.

In an embodiment, each of the first to third selection signals SEL1, SEL2, and SEL3 may be selectively enabled according to a mode of the semiconductor apparatus 300, as shown in the table 6.

TABLE 6

| READ | WRITE | FM | VM | SEL1 | SEL2 | SEL3 |
|---|---|---|---|---|---|---|
| ○ | X | Enable | Disable | Disable | Enable | Disable |
| ○ | X | Enable | Enable | Enable | Disable | Enable |
| ○ | X | Disable | Don't Care | Enable | Disable | Enable |
| X | ○ | Enable | Don't Care | Enable | Disable | Enable |
| X | ○ | Disable | Disable | Enable | Disable | Enable |
| X | ○ | Disable | Enable | Disable | Enable | Disable |

When the semiconductor apparatus 300 performs the read operation, the frequency mode FM being enabled and the voltage mode VM being disabled, the global clock tree 600 might not generate the first distribution clock signal DCK_CMOS and may generate the second distribution clock signal DCK_CML, The first selection signal SEL1 may be disabled, the second selection signal SEL2 may be enabled, and the third selection signal SEL3 may be disabled. The first selection circuit 712 may select the output signal from the CML-CMOS converter 711 according to first selection signal SEL1, and the first driver 713 may generate the data output dock signal RCK based on the second distribution dock signal DCK_CML. Although the second selection circuit 722 may select the first distribution clock signal DCK_CMOS according to the second selection signal SEL2, the first distribution clock signal DCK_CMOS might not be generated, and therefore, the second driver 723 might not generate the data input clock signal ICK, The third selection circuit 732 may select the second distribution clock signal DCK_CML according to the third selection signal SEL3, and the third driver 733 may generate the data output clock signal RCK based on the second distribution clock signal DCK_CML.

When the semiconductor apparatus 300 performs the read operation, the frequency mode FM being enabled and the voltage mode VM being enabled, the global clock tree 600 may generate the first distribution clock signal DCK_CMOS and might not generate the second distribution clock signal DCK_CML. The first selection signal SEL1 may be enabled, the second selection signal SEL2 may be disabled, and the third selection signal SEL3 may be enabled. The first selection circuit 712 may select the first distribution clock signal DCK_CMOS according to the first selection signal SELL and the first driver 713 may generate the data output clock signal RCK based on the first distribution clock signal DCK_CMOS. Although the second selection circuit 722 may select the output signal from the CML-CMOS converter 711 according to the second selection signal SEL2, the second distribution clock signal DCK_CML might not be generated, and therefore, the second driver 723 might not generate the data input clock signal ICK. The third selection circuit 732 may select the first distribution clock signal DCK_CMOS according to the third selection signal SEL3, and the third driver 733 may generate the data output clock signal RCK based on the first distribution clock signal DCK_CMOS.

When the semiconductor apparatus 300 performs the read operation and the frequency mode FM is disabled, the global clock tree 600 may generate the first distribution clock signal DCK_CMOS and might not generate the second distribution clock signal DCK_CML, regardless of the voltage mode VM, The first selection signal SEL1 may be enabled, the second selection signal SEL2 may be disabled, and the third selection signal SEL3 may be enabled. The first selection circuit 712 may select the first distribution clock signal DCK_CMOS according to the first selection signal SEL1, and the first driver 713 may generate the data output clock signal RCK based on the first distribution clock signal DCK_CMOS. Although the second selection circuit 722 may select the output signal from the CML-CMOS converter 711 according to the second selection signal SEL2, the second distribution clock signal DCK_CML might not be generated, and therefore, the second driver 723 might not generate the data input clock signal ICK. The third selection circuit 732 may select the first distribution clock signal DCK_CMOS according to the third selection signal SEL3, and the third driver 733 may generate the data output dock signal RCK based on the first distribution clock signal DCK_CMOS.

When the semiconductor apparatus 300 performs the write operation and the frequency mode FM is enabled, the global clock tree 600 might not generate the first distribution clock signal DCK_CMOS and may generate the second distribution clock signal DCK_CML, regardless of the voltage mode VM, The first selection signal SEL1 may be enabled, the second selection signal SEL2 may be disabled, and the third selection signal SEL3 may be enabled. Although the first selection circuit 712 may select the first distribution clock signal DCK_CMOS according to the first selection signal SEL1, the first distribution clock signal DCK_CMOS might not be generated, and therefore, the first driver 713 might not generate the data output clock signal RCK. The second selection circuit 722 may select the output signal from the CML-CMOS converter 711 according to the second selection signal SEL2, and therefore, the second driver 723 may generate the data input clock signal ICK based on the second distribution clock signal DCK_CML, Although the third selection circuit 732 may select the first distribution clock signal DCK_CMOS according to the third selection signal SEL3, the first distribution clock signal DCK_CMOS might not be generated, and therefore, the third driver 733 might not generate the data output clock signal RCK.

When the semiconductor apparatus 300 performs the write operation, the frequency mode FM being disabled and the voltage mode VM being disabled, the global dock tree 600 might not generate the first distribution dock signal DCK_CMOS and may generate the second distribution clock signal DCK_CML. The first selection signal SEL1 may be enabled, the second selection signal SEL2 may be disabled, and the third selection signal SEL3 may be enabled, Although the first selection circuit 712 may select the first distribution clock signal DCK_CMOS according to the first selection signal SEL1, the first distribution clock signal DCK_CMOS might not be generated, and therefore, the first driver 713 might not generate the data output clock signal RCK. The second selection circuit 722 may select the output signal from the CML-CMOS converter 711 according to the second selection signal SEL2, and therefore, the second driver 723 may generate the data input clock signal ICK based on the second distribution clock signal DCK_CML, Although the third selection circuit 732 may select the first distribution clock signal DCK_CMOS according to the third selection signal SEL3, the first distribution clock signal DCK_CMOS might not be generated, and therefore, the third driver 733 might not generate the data output clock signal RCK.

When the semiconductor apparatus 300 performs the write operation, the frequency mode FM being disabled and the voltage mode VM being enabled, the global clock tree 600 may generate the first distribution clock signal DCK_CMOS and might not generate the second distribution clock signal DCK_CML. The first selection signal SEL1 may be disabled, the second selection signal SEL2 may be enabled, and the third selection signal SEL3 may be disabled, Although the first selection circuit 712 may select the output signal from the CML-CMOS converter 711 according to the first selection signal SEL1, the second distribution dock signal DCK_CML might not be generated, and therefore, the first driver 713 might not generate the data output clock signal RCK. The second selection circuit 722 may select the first distribution clock signal DCK_CMOS according to the second selection signal SEL2, and therefore, the second driver 723 may generate the data input clock signal ICK based on the first distribution clock signal DCK_CMOS. Although the third selection circuit 732 may select the output signal from the CML-CMOS converter 711 according to the third selection signal SEL3, the second distribution clock signal DCK_CML might not be generated, and therefore, the third driver 733 might not generate the data output clock signal RCK. In accordance with an embodiment, the semiconductor apparatus may drive the system clock signal according to the different manners of the CML level and the CMOS level to distribute the driven signal to the plurality of data input/output circuits. According to the various modes of the semiconductor apparatus, the plurality of data input/output circuits may perform the data output operation according to one of the distribution clock signal driven to the CML level and the distribution clock signal driven to the CMOS level and may perform the data input operation according to one of the distribution clock signal driven to the CML level and the distribution clock signal driven to the CMOS level. Therefore, the performance of the semiconductor apparatus may be optimized.

While certain embodiments have been described above, it will be understood to those skilled in the art that the embodiments described are by way of example only. Accordingly, the semiconductor apparatus performing a plurality of clock signaling operations and the semiconductor system including the same should not be limited based on the described embodiments. Rather, the semiconductor apparatus performing a plurality of clock signaling operations and the semiconductor system including the same described herein should only be limited in light of the claims that follow when taken in conjunction with the above description and accompanying drawings.

What is claimed is:

1. A semiconductor apparatus comprising:
    a global dock tree configured to drive a system dock signal to a complementary metal oxide semiconductor (CMOS) level to generate a first distribution dock signal and configured to drive the system dock signal to a current mode logic (CML) level to generate a second distribution dock signal;
    a data output circuit configured to output data based on the first distribution dock signal; and
    a data input circuit configured to receive the data based on the second distribution clock signal.

2. The semiconductor apparatus of claim 1, wherein the system clock signal is a signal swinging to a CML level.

3. The semiconductor apparatus of claim 1, wherein the global clock tree includes:
    a CML-CMOS converter configured to convert the system clock signal to a signal swinging to a CMOS level;
    a CMOS driver configured to drive an output signal from the CML-CMOS converter to generate the first distribution clock signal; and
    a CML driver configured to drive the system clock signal to a CML level to generate the second distribution clock signal.

4. The semiconductor apparatus of claim 1, further comprising a local dock tree configured to receive the first distribution dock signal and the second distribution dock signal, configured to generate a data output dock signal from the first distribution dock signal, and configured to generate a data input dock signal from the second distribution dock signal, and
    wherein the data output circuit is configured to output the data in synchronization with the data output clock signal, and the data input circuit is configured to receive the data in synchronization with the data input dock signal.

5. The semiconductor apparatus of claim 4, wherein the local dock tree includes:
    a first driver configured to drive the first distribution dock signal to generate the data output dock signal;
    a CML-CMOS converter configured to convert the second distribution dock signal to a signal swinging to a CMOS level; and
    a second driver configured to drive an output signal from the CML-CMOS converter to generate the data input dock signal.

6. The semiconductor apparatus of claim 1, further comprising:
a local clock tree configured to generate a data output clock signal based on the first distribution clock signal; and
a read dock output circuit coupled to the local dock tree and configured to output the data output dock signal, and
wherein the data output dock signal, output from the read dock output circuit, is synchronized with the data that are output from the data output circuit.

7. A semiconductor apparatus comprising:
a global clock tree configured to:
drive a system clock signal to a complementary metal oxide semiconductor (CMOS) level to generate a first distribution clock signal and transmit the first distribution clock signal through a first clock transmission line;
drive the system clock signal to a current mode logic (CML) level to generate a second distribution clock signal and transmit the second distribution clock signal through a second clock transmission line; and
a local clock tree configured to:
receive the first distribution clock signal through the first clock transmission line and generate a read clock signal based on the first distribution clock signal;
receive the second distribution clock signal through the second clock transmission line and generate a write clock signal based on the second distribution clock signal.

8. The semiconductor apparatus of claim 7, wherein the system clock signal is a signal swinging to a CML level.

9. The semiconductor apparatus of claim 7, wherein the global clock tree includes:
a CML-CMOS converter configured to convert the system dock signal to a signal swinging to a CMOS level;
a CMOS driver configured to drive an output signal from the CML-CMOS converter to generate the first distribution dock signal; and
a CML driver configured to drive the system dock signal to a CML level to generate the second distribution clock signal.

10. The semiconductor apparatus of claim 7, wherein the local clock tree includes:
a first driver configured to drive the first distribution clock signal to generate the read clock signal;
a CML-CMOS converter configured to convert the second distribution clock signal to a signal swinging to a CMOS level; and
a second driver configured to drive an output signal from the CML-CMOS converter to generate the write clock signal.

11. The semiconductor apparatus of claim 7, further comprising:
a data output circuit configured to output, in synchronization with the read clock signal, data to an external apparatus; and
a data input circuit configured to receive, in synchronization with the write clock signal, the data that are provided from the external apparatus.

12. The semiconductor apparatus of claim 11, further comprising a read dock output circuit configured to transmit the read dock signal to the external apparatus,
wherein the read clock signal that is output from the read dock output circuit is synchronized with the data that are output from the data output circuit.

13. A semiconductor apparatus comprising:
a global dock tree configured to:
receive a system clock signal and generate a first distribution dock signal during a read operation of the semiconductor apparatus; and
generate a second distribution dock signal during a write operation of the semiconductor apparatus, the second distribution dock signal swinging within a smaller range than the first distribution clock signal; and
a local clock tree configured to generate a data output dock signal from the first distribution dock signal during the read operation and configured to generate a data input clock signal from the second distribution dock signal during the write operation.

14. The semiconductor apparatus of claim 13, wherein the system clock signal is a signal swinging to a current mode logic (CML) level.

15. The semiconductor apparatus of claim 13, wherein the global clock tree includes:
a CML-CMOS converter configured to convert the system dock signal to a signal swinging to a complementary metal oxide semiconductor (CMOS) level;
a CMOS driver configured to drive, based on a first enable signal, an output signal from the CML-CMOS converter to generate the first distribution clock signal; and
a CML driver configured to drive, based on a second enable signal, the system clock signal to a CML level to generate the second distribution clock signal.

16. The semiconductor apparatus of claim 13, wherein the local clock tree includes:
a first driver configured to drive the first distribution clock signal to generate the data output clock signal;
a CML-CMOS converter configured to convert the second distribution clock signal to a signal swinging to a CMOS level; and
a second driver configured to drive an output signal from the CML-CMOS converter to generate the data input clock signal.

17. The semiconductor apparatus of claim 13, further comprising:
a data output circuit configured to output, based on the data output dock signal, data to an external apparatus; and
a data input circuit configured to receive, based on the data input dock signal, data that are provided from the external apparatus.

18. The semiconductor apparatus of claim 17, wherein the local clock tree is configured to output the data output clock signal as a strobe signal to the external apparatus.

* * * * *